(12) United States Patent  
Kobayashi

(10) Patent No.: US 7,760,261 B2
(45) Date of Patent: *Jul. 20, 2010

(54) TWO-BRANCH OUTPUTTING SOLID-STATE IMAGING DEVICE AND IMAGING APPARATUS

(75) Inventor: Makoto Kobayashi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 506 days.

This patent is subject to a terminal disclaimer.

(21) Appl. No.: 11/709,763

(22) Filed: Feb. 23, 2007

(65) Prior Publication Data

US 2007/0216970 A1    Sep. 20, 2007

(30) Foreign Application Priority Data

Feb. 23, 2006  (JP)  ............................ P2006-047078

(51) Int. Cl.
*H04N 3/14* (2006.01)
*H01L 29/762* (2006.01)
*H01L 29/765* (2006.01)

(52) U.S. Cl. ................ 348/311; 348/294; 348/302; 348/303; 348/316; 257/183.1; 257/222; 257/443

(58) Field of Classification Search .................. None
See application file for complete search history.

(56) References Cited

U.S. PATENT DOCUMENTS

| 4,628,347 A | * | 12/1986 | Sato et al. | ............... 327/407 |
| 5,303,053 A | * | 4/1994 | Miyatake et al. | ............. 348/312 |
| 5,309,240 A | * | 5/1994 | Miwada | ...................... 348/311 |
| 7,446,349 B2 | * | 11/2008 | Kobayashi et al. | ....... 257/183.1 |
| 2002/0126213 A1 | * | 9/2002 | Hynecek | ..................... 348/241 |
| 2004/0032519 A1 | * | 2/2004 | Oda et al. | ................... 348/294 |
| 2007/0115380 A1 | * | 5/2007 | Shibata et al. | ............. 348/311 |
| 2007/0229691 A1 | * | 10/2007 | Oshima et al. | ............. 348/315 |

FOREIGN PATENT DOCUMENTS

| JP | 5-308575 A | 11/1993 |
| JP | 2624138 B2 | 4/1997 |
| JP | 2949861 B2 | 7/1999 |

* cited by examiner

*Primary Examiner*—David L Ometz
*Assistant Examiner*—Dwight Alex C Tejano
(74) *Attorney, Agent, or Firm*—Birch, Stewart, Kolasch & Birch, LLP

(57) ABSTRACT

A solid-state imaging device is provided and includes: a semiconductor substrate having a two-dimensional array of photoelectric conversion elements, each storing a signal charge in accordance with a received amount of light; a charge transfer path that transfers the signal charge read out of the photoelectric conversion elements toward an output end of the solid-state imaging device; and a branching part having two branches, the branching part receiving the signal charge transferred along the charge transfer path and distributing the signal charge toward one of the two branches alternately. The charge transfer path has an end portion narrowed in channel width and connected to the branching part.

8 Claims, 13 Drawing Sheets

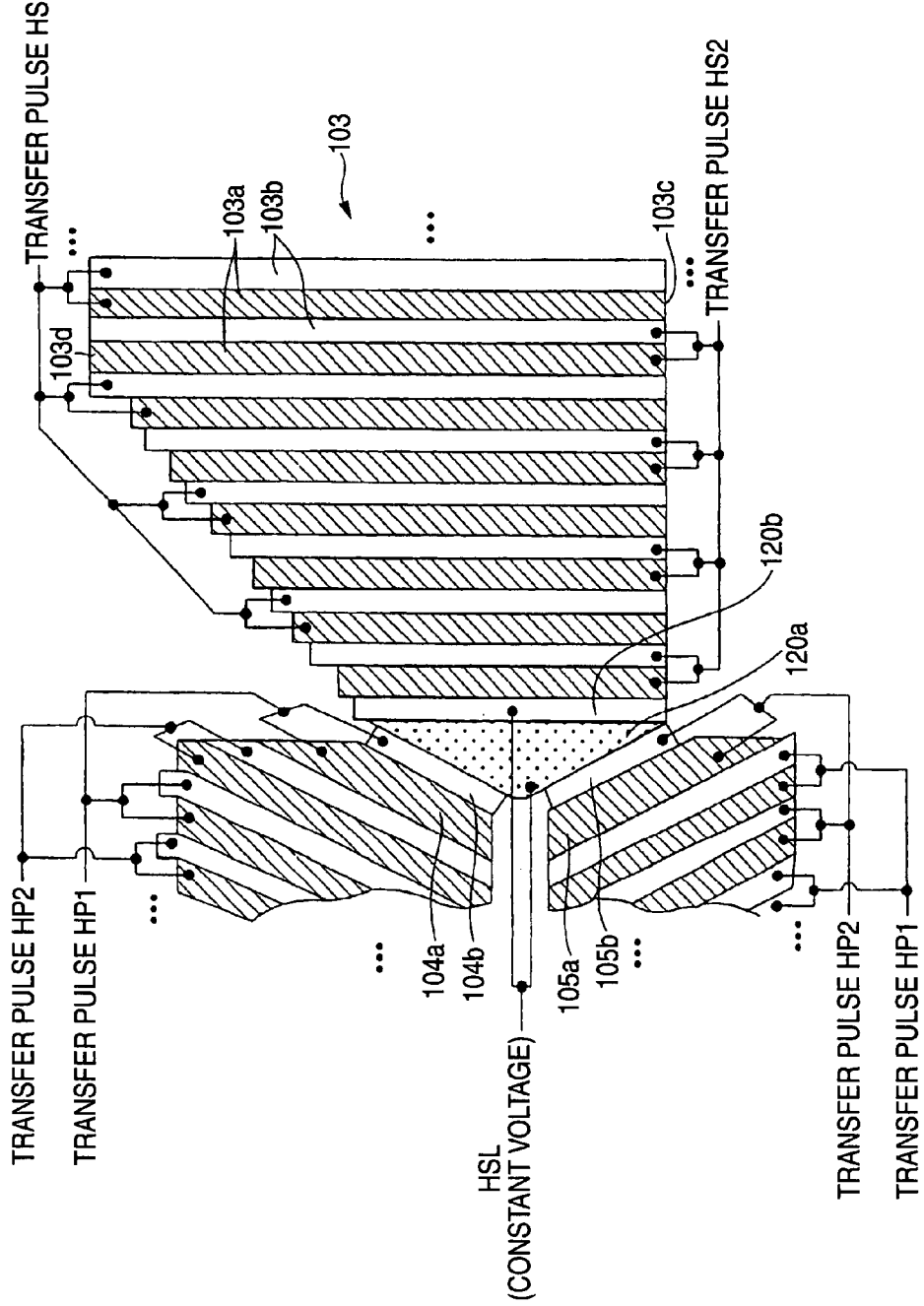

FIG. 6
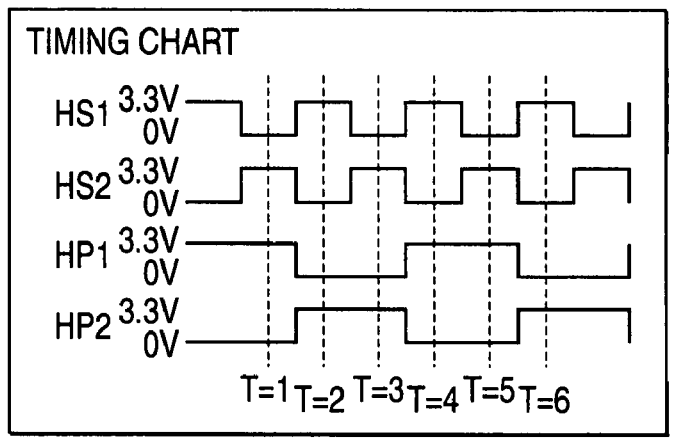
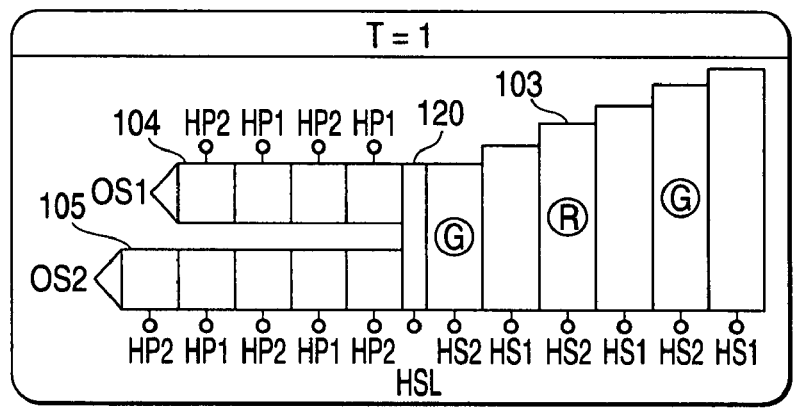
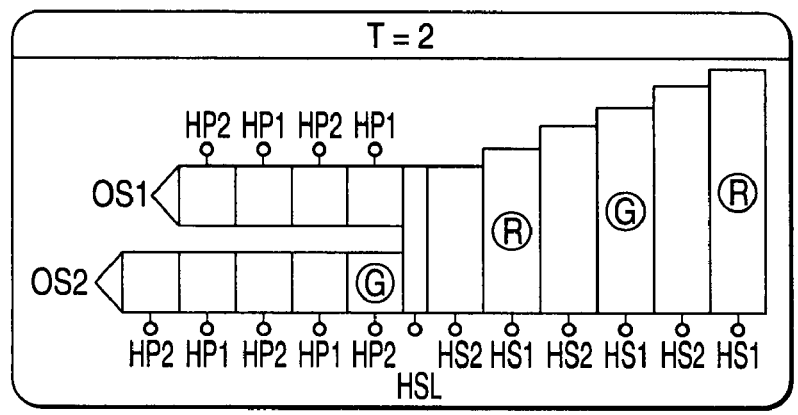

TWO-BRANCH OUTPUTTING SOLID-STATE IMAGING DEVICE AND IMAGING APPARATUS

BACKGROUND OF THE INVENTION

1. Field of the Invention

The present invention relates to a CCD (charge coupled device) solid-state imaging device and imaging apparatus having a charge transfer path (transfer register) whose output end is branched into two parallel parts, and more particularly to a two-branch outputting solid-state imaging device and imaging apparatus that the signal charges distributed to the branch output ends are converted into voltage signals and output by separate amplifiers.

2. Description of Related Art

The CCD solid-state imaging device recently has pixels increasing in the number, e.g. having several million pixels, along with the progress of semiconductor micro-fabrication techniques. This requires an increased frequency to drive the horizontal transfer path from which a signal is to be read, thus incurring an issue of a waveform disturbance in the voltage signal output from the output amplifier.

In such a situation, there is developed an art that the horizontal transfer path is branched parallel at its output end to drive the horizontal transfer path at higher frequency so that the signal charges, sequentially transferred over the horizontal transfer path, can be distributed in order at a distributor (branching part) into branch transfer paths, thereby providing the drive frequency to the branch transfer path lower than the drive frequency to the horizontal drive line (e.g. JP-A-5-308575, Japanese Patent No. 2,949,861 and Japanese Patent No. 2,624,138).

The technique described in JP-A-5-308575 is structured that the output end of the horizontal transfer path is branched into three parts so that signal charges R (red), G (green) and B (blue) can be respectively distributed to the branch transfer paths where those are transferred and output. Thus, the drive frequency to the branch transfer paths is provided one-thirds of the drive frequency to the horizontal transfer path.

However, for the solid-state imaging having several millions of pixels or more allowing for taking an image with definition, e.g. high vision of image quality, there is a need to drive the horizontal transfer path at considerably high frequency. There is a difficulty in well distributing the signal charges at the distributor part into three lines while maintaining the transfer efficiency high (i.e. with no or less remaining charge).

Japanese Patent No. 2,949,861 and Japanese Patent No. 2,624,138 describe the techniques that propose two-branch outputting solid-state imaging devices. The two-branch outputting type is easy to distribute the signal charges to branch lines as compared to that in the three-branch outputting type. Besides, it is advantageous in that the drive frequency to the horizontal transfer path is satisfactorily double the drive frequency to the branch transfer paths.

However, Japanese Patent No. 2,949,861 and Japanese Patent No. 2,624,138 fail to describe the transfer of color-image signal charges. In the two-branch outputting solid-state imaging device, unless charges are distributed with efficiency at the branching part, the residual portion of signal charge distributed preceding in stage, e.g. red, is mixed in the next stage of signal charge, e.g. green, thus raising a problem of image deterioration in the image taken.

The two-branch outputting solid-state imaging device has an advantage that data rate can be increased over the horizontal transfer path because of the capability of lowering the post-branch drive frequency down to a half. However, unless charge distribution is effected with efficiency, a color mixture results to problematically deteriorate the quality of image.

SUMMARY OF THE INVENTION

An object of an illustrative, non-limiting embodiment of the invention is to provide a two-branch outputting solid-state imaging device and imaging apparatus capable of distributing charges with efficiency and reproducing a taken color image with quality.

According to an aspect of the invention, there is provided a solid-state imaging device including:

a semiconductor substrate having a two-dimensional array of photoelectric conversion elements, each storing a signal charge in accordance with a received amount of light;

a charge transfer path that transfers the signal charge read out of the photoelectric conversion elements toward an output end of the solid-state imaging device; and a branching part having two branches, the branching part receiving the signal charge transferred along the charge transfer path and distributing the signal charge toward one of the two branches alternately, wherein the charge transfer path has an end portion narrowed in channel width and connected to the branching part.

In the solid-state imaging device, the end portion of the charge transfer path may be narrowed in channel width from one side in a width direction of the charge transfer path.

In solid-state imaging device, the photoelectric conversion elements may include: a plurality of first photoelectric conversion elements that store a first signal charge in accordance with a received amount of light having a first color; a plurality of second photoelectric conversion elements that store a second signal charge in accordance with a received amount of light having a second color; and a plurality of third photoelectric conversion elements that store a third signal charge in accordance with a received amount of light having a third color.

In the solid-state imaging device, the first color may be red of three primary colors, the second color may be green of the three primary colors, and the third color may be blue of the three primary colors, and the end portion of the charge transfer path may narrowed in channel width from one side in a width direction of the charge transfer path, one of the two branches of the branching part may be located on the one side in the width direction of the charge transfer path, and the signal charge with respect to each of blue and red may be distributed toward the one of the two branches.

In the solid-state imaging device, each of the two branches of the branching part may have a branch transfer path.

In the solid-state imaging device, the branching part may have a branch electrode to which a fixed potential is applied so that the signal charge entered the branching part can flow to the one of the two branches without change.

In the solid-state imaging device, the branch electrode may be in a flat isosceles triangle form, in which a bottom of the flat isosceles triangle form is continuously connected to the charge transfer path, one side of isosceles of the flat isosceles triangle form is continuously connected to one of the two branches, the other side of the isosceles is continuously connected to the other of the two branches.

In the solid-state imaging device, the photoelectric conversion elements may be in a honeycomb arrangement on the semiconductor substrate.

In the solid-state imaging device, the charge transfer path may includes: a plurality of vertical transfer paths that transfer the signal charge in one direction along a surface of the semiconductor substrate; a horizontal transfer path that receives the signal charge and transfers the signal charge in a direction perpendicular to the one direction; and a line memory that receives the signal charge transferred through the vertical transfer paths and outputs the signal charge into the horizontal transfer path in a timing, and the branching part may be connected to the end of the horizontal transfer line.

According to an aspect of the invention, there is provided an imaging apparatus including:

a solid-state imaging device as described above; and a signal processing unit that integrates voltage signals output from the solid-state imaging device with respect to each of the lights having the first, second and third colors, and that makes white balance correction.

BRIEF DESCRIPTION OF THE DRAWINGS

The features of the invention will appear more fully upon consideration of the exemplary embodiments of the inventions, which are schematically set forth in the drawings, in which:

FIG. 3 is a detailed surface view of a charge distributor (branching part) shown in FIG. 2;

FIG. 6 is a view exemplifying the order of the colors to be transferred from the FIG. 2 horizontal transfer path to the branch transfer paths;

DETAILED DESCRIPTION OF THE EXEMPLARY EMBODIMENTS

Although the invention will be described below with reference to the exemplary embodiment thereof, the following exemplary embodiment and its modification do not restrict the invention.

According to an exemplary embodiment of the invention, a two-branch outputting solid-state imaging device can restrict the existence range of signal charges at the charge transfer path end and then to distribute the signal charges at the branching part into two branches, thus allowed to distribute the charges with efficiency and reproduce a quality color image.

Meanwhile, the charge transfer path end can be narrowed in channel width at one side thereof so that the signal charges for red and blue can be distributed to the branch on the narrowed side while the signal charge for green can be distributed to the branch on the side not narrowed. Accordingly, even if there is left a residual portions of the charges, it can be prevented from appearing as a fixed pattern of noise in the image.

With reference to the drawings, explanation will be now made on exemplary embodiments of the present invention.

Figure 1:
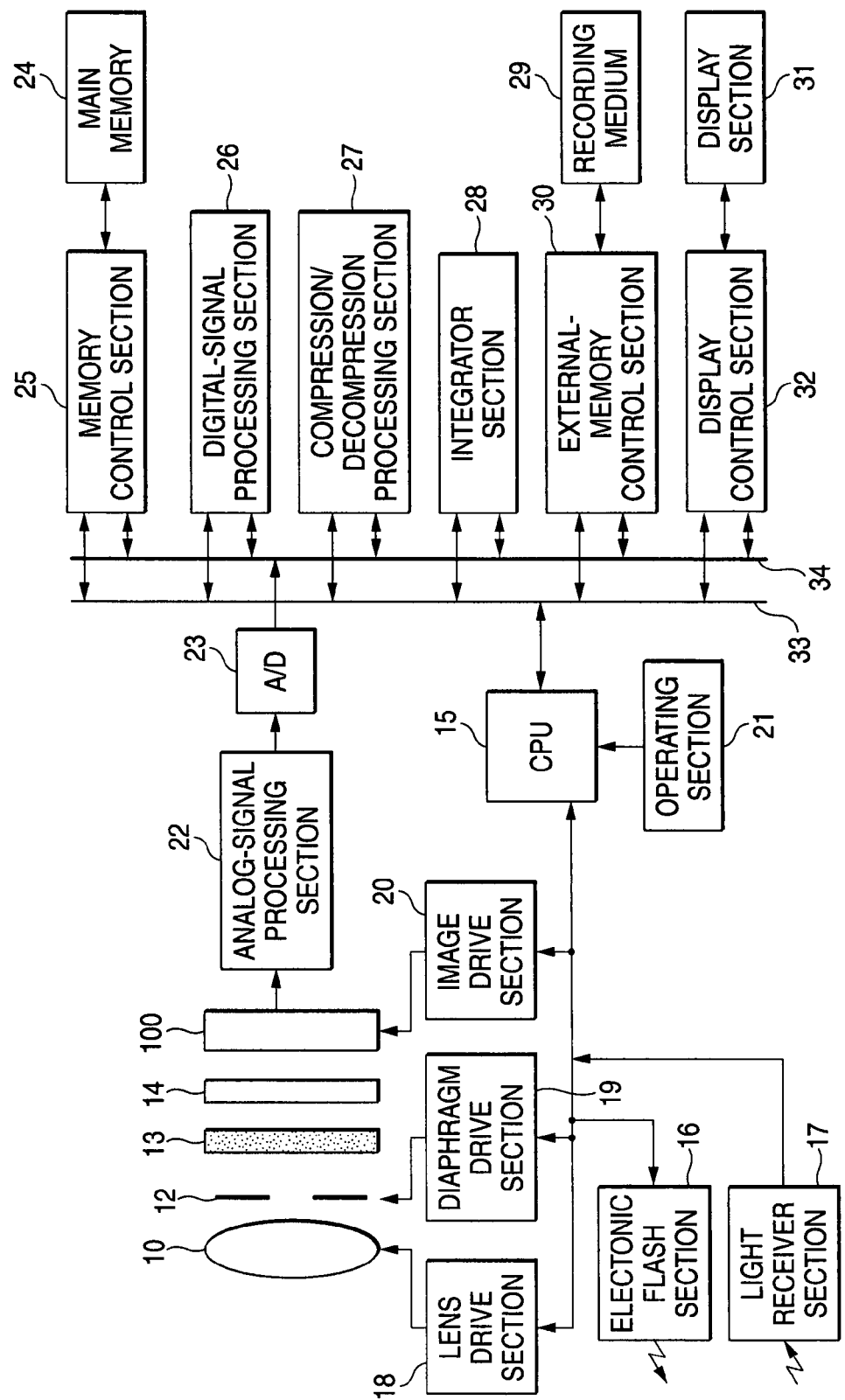
FIG. 1 shows a functional block diagram of a digital camera according to an exemplary embodiment of the present invention.

FIG. 1 is a configuration diagram of a digital camera according to one exemplary embodiment of the invention. The digital camera, shown in the figure, includes an objective lens 10, a CCD solid-state imaging device 100 to be detailed later, and a diaphragm 12, an infrared absorbing filter 13 and an optical low-pass filter 14 arranged between the objective lens and the CCD solid-state imaging device. The CPU 15, for totally controlling the digital camera, is to take control of an electronic flash section 16 and a light receiver section 17, thus controlling a lens drive section 18 and adjusting the objective lens 10 into a focal point. It also controls a diaphragm drive section 19 to regulate the opening of the diaphragm 12, thus effecting exposure adjustment.

Meanwhile, the CPU 15 drives the solid-state imaging device 100 through an imaging drive section and outputs a subject image, taken through the objective lens 10, as a color signal. The CPU 15 allows the user to input an instruction signal through an operating section 21 so that the CPU 15 can take control of various sections in accordance with such instructions.

The electric system of the digital camera has an analog-signal processing section 22 connected to an output of the solid-state imaging device 100 and an A/D converter circuit 23 that converts the RGB color signal, output from the analog-signal processing circuit 22, into a digital signal. Those are to be controlled by the CPU 15.

The electric control system of the digital camera further has a memory control section 25 connected to a main memory (frame memory) 24, a digital-signal processing section 26 that performs interpolation and gamma arithmetic operations, RGB/YC conversion, etc., a compression/decompression processing section 27 that compresses a photographic image into a JPEG image and decompresses a compressed image, an integrator section 28 that integrates photometric data and determines a gain of white balance correction the digital-signal processing section 26 is to perform, an external-memory control section 30 to which a rewritable recording medium 29 is to be connected, and a display control section 32 connected with a liquid-crystal display section 31 mounted in the backside of the camera or so. Those are in mutual connection by way of a control bus 33 and a data bus 34, thus being controlled according to the command of from the CPU 15.

Figure 2:
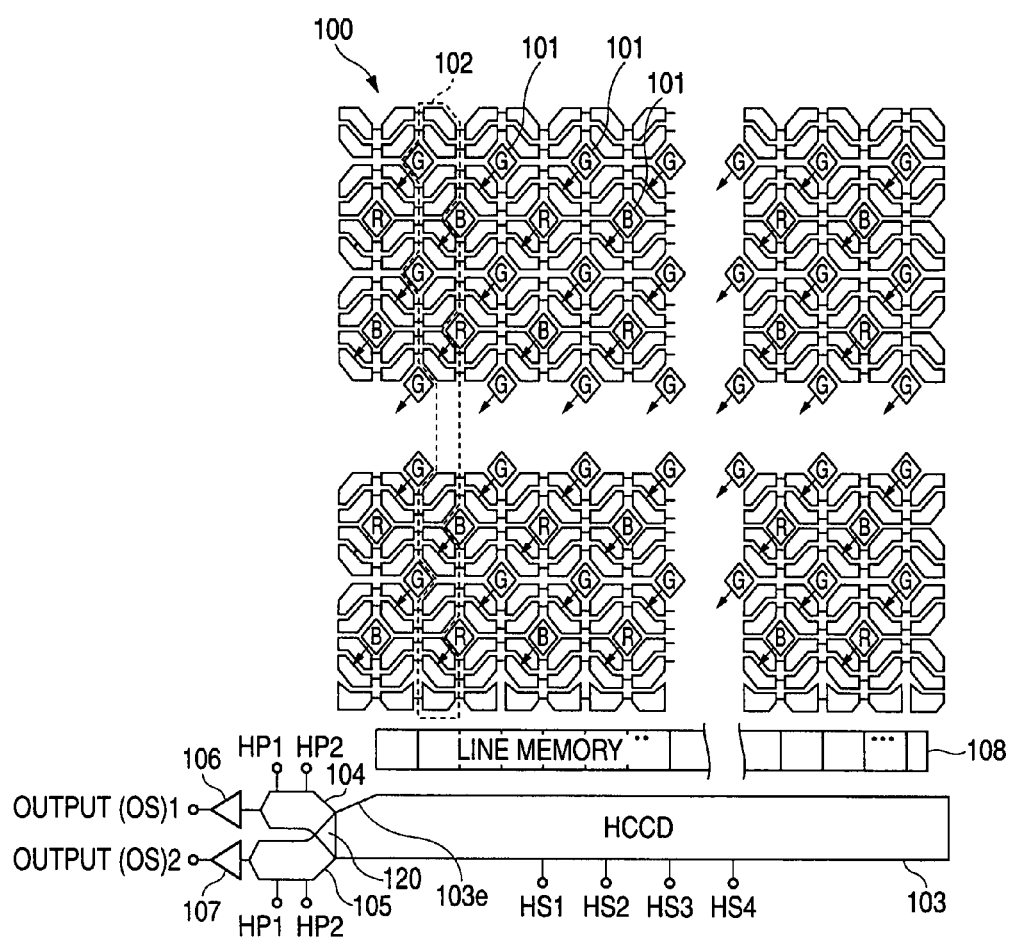
FIG. 2 is a surface view of a two-branch outputting solid-state imaging device shown in FIG. 1.

FIG. 2 is a plan view of the solid-state imaging device 100 that was shown in FIG. 1. The solid-state imaging device 100 in the figure is made as a two-branch outputting type. The solid-state imaging device 100 is arranged with a multiplicity of photodiodes (photoelectric converter elements) 101 in a two-dimensional array form on a semiconductor substrate thereof. The photodiodes 101 on the even line are arranged deviated a half pitch relative to the photodiodes 101 on the even line (i.e. in so-called a honeycomb pixel arrangement).

The notations "R", "G" and "B", given on the photodiodes 101, each represent a color (R: red, G: green, B: blue) of the filter laid on the photodiode. Each photodiode 101 is to store a signal charge in accordance with a received amount of the light in one of the primary three colors. Note that the explanation is on the example having primary-color based filters. Alternatively, complementary-color based filters may be used.

Vertical transfer electrodes are laid extending zigzag horizontally on a surface of the semiconductor substrate, in a manner avoiding the photodiodes 101. In the semiconductor substrate, buried channels, not shown, are formed extending laterally of the vertical photodiode arrays and extending zigzag vertically in a manner avoiding the photodiodes 101. Vertical transfer paths (VCCDs) 102 are each formed by the buried channel and the vertical transfer electrode arranged thereon and extending zigzag vertically.

A horizontal transfer path (HCCD) 103 is provided in a lower side location of the semiconductor substrate. The horizontal transfer path 103 is structured with a buried channel and a horizontal transfer electrode provided thereon. The horizontal transfer path 103 is to be driven on two phases, according to the transfer pulses HS1, HS2, HS3 and HS4 output from the imager drive section 20.

The horizontal transfer path 103 has an output end that is branched into two, i.e. a first branch transfer path 104 and a second branch transfer path 105, through the charge distributor (charge branching part) 120. The first and second branch transfer paths 105, 106 are similar in structure (in respect of their buried channels and transfer electrodes) to the horizontal transfer path 103. The first branch transfer path 104 has an output end provided with a first output amplifier 106 to output a voltage signal in accordance with an amount of the signal charge transferred to the relevant output end while the second branch transfer path 105 has an output end provided with a second output amplifier 107 to output a voltage signal in accordance with an amount of the signal charge transferred to the relevant output end.

The first and second branch transfer paths 104, 105 are driven on two phases, according to the transfer pulses HP1, HP2 generated by frequency-dividing, into a half, the transfer pulses HS1 (=HS3), HS2 (=HS4) driving the horizontal transfer path 103 by means of the imager drive section 20.

In the two-branch outputting type solid-state imaging device 100 of this embodiment, a line memory 108 is provided in a boundary of between the ends of the vertical transfer paths 102 and the horizontal transfer path 103 in a manner extending along the horizontal transfer path 103.

The line memory 108 is used to temporarily store the signal charge received from the vertical transfer paths 102 and control the timing to output it onto the horizontal transfer path 103 thereby making a summing up over pixels of signal charges, as described in JP-A-2002-112119 for example. Summing up over pixels is made for taking a moving image by means of a digital camera, i.e. in outputting a size-reduced image. Summing up over pixels is not performed in taking a still image.

Although the embodiment showed the two-branch outputting type solid-state imaging having the line memory 108, the signal charges transferred through the vertical transfer paths 102 may be directly conveyed onto the horizontal transfer path 103 without using the line memory 108. Meanwhile, although explanation was made on the color solid-state imaging device 100 in the honeycomb pixel arrangement, the solid-state imaging may be arranged with photodiodes in a square grid form and color filters in a Bayer arrangement.

Incidentally, the term "vertical" and "horizontal" used means respectively "in one direction" and "in a direction nearly perpendicular to the one direction" and along the surface of the semiconductor substrate.

FIG. 3 is a surface typical view showing the detail of the charge distributor 120 provided at the FIG. 2 connection of between the horizontal transfer path 103 and branch transfer paths 104, 105 that were shown in FIG. 2. The horizontal transfer path 103 is formed by a buried channel and repetitive sets of a first layer electrode 103a and a second layer electrode 103b provided thereon. This is made in a well-known structure that a transfer pulse HS1 is to be applied to every other one of the sets of first and second electrodes 103a, 103b while a transfer pulse HS2 opposite in phase to the transfer pulse HS1 is to be applied to the remaining other ones of the sets.

The horizontal transfer path 103 in the embodiment is formed such that its buried channel has a width gradually narrowed as the charge distributor 120 is neared, wherein the first and second layer electrodes 103a, 103b are made shorter correspondingly to those. In the illustrated embodiment, the horizontal transfer path 103 has a width narrowed to approximately a half in a manner such that the upper side 103a gradually nears to the bottom side 103c thereof.

A charge distributor 120 is provided between the horizontal transfer path 103 and the branch transfer paths 104, 105. The charge distributor 120 has a distribution electrode (branching electrode) formed by the first and second layer electrodes 120a, 120b overlying the buried channel formed narrow in width.

The first layer electrode 120a is in the form of a flat isosceles triangle. The flat isosceles triangle has a bottom laid with a strip-formed second layer electrode 120b at its end through an insulation layer. A fixed voltage HSL is to be applied from the imager drive section 20 to the first and second layer electrodes 120a, 120b.

The first branch transfer path 104 is provided continuously to one side of the distribution electrode 120a while the second branch transfer path 105 is continuously to the other side of the distribution electrode 120a. The horizontal transfer path 103 in this embodiment is structured gradually restricted in its channel width at one side thereof closer to the charge distributor 120.

The first and second branch transfer electrodes 104, 105 are each formed by a buried channel and sets of a first layer electrode (104a, 105a) and a second layer electrode (104b, 105b) laid repeatedly thereon so that a transfer pulse HS1 can be applied to every other one of the sets of first and second electrodes 103a, 103b while a transfer pulse HS2 opposite in phase to the transfer pulse HS1 can be to the remaining other ones of the sets.

When a transfer pulse HP1 is applied to the first and second layer electrodes 104a, 104b of the first branch transfer path 104 that are adjacent closest to the distribution electrode 120a, a transfer pulse HP2 is applied to the first and second layer electrodes 105a, 105b of the second branch transfer path 105 that are adjacent closest to the distribution electrode 120a.

Figures 4A, 4B:
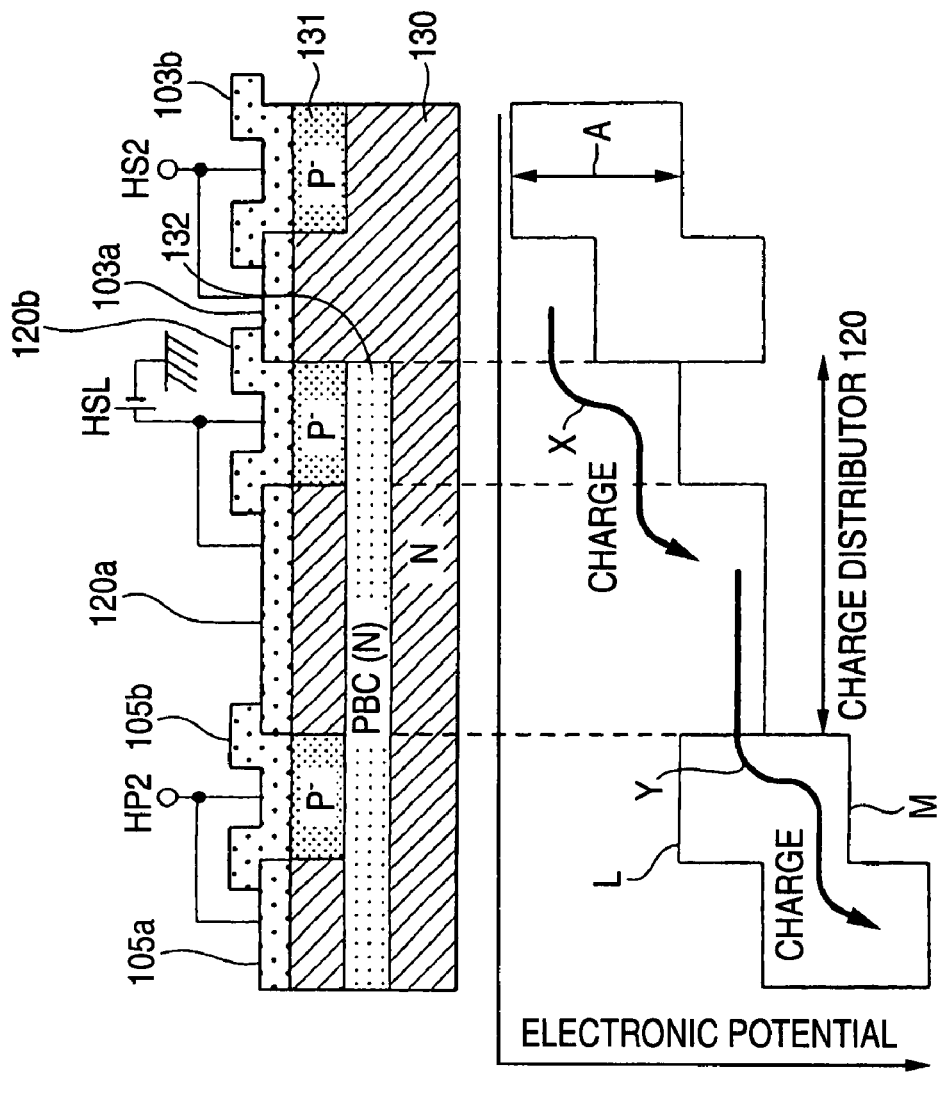
FIG. 4A is a sectional view of the charge distributor shown in FIG. 2
FIG. 4B is a potential diagram thereof.

FIG. 4A shows a sectional view of the semiconductor substrate in a region of the charge distributor 120, and FIG. 4B shows a potential diagram.

An n-type buried channel 130 is formed in a p-well layer formed in a surface of an n-type semiconductor substrate. On the surface of the semiconductor substrate, a first electrode film 103a, 120a, 105a (104a for the first branch transfer path) is formed through an insulation layer, not shown. A second electrode film 103b, 120b, 105b (104b) is formed between the first electrode films through not-shown insulation films.

In the immediately below of the second electrode film 103b, 120b, 105b (104b), p⁻ locations 131 are formed in the buried channel 130. In the location covering the charge distribution 120 and the first and second branch transfer paths 104, 105, an n-type layer 132 is buried to regulate the potential on the charge distribution 120 and first and second branch transfer paths 104, 105 to a predetermined value.

In the solid-state imaging device 100 thus structured, the signal charge stored on the FIG. 2 photodiodes 101 is read onto the vertical transfer path 102 and transferred in the vertical direction. When the vertically transferred signal charge is transferred onto the horizontal transfer path 103, horizontal transfer pulses HS1, HS2 are applied to the horizontal transfer path 103. All the signal charges on the horizontal transfer paths 103 are sequentially transferred along the horizontal transfer path 103 and to the charge distributor 120.

Figure 5:
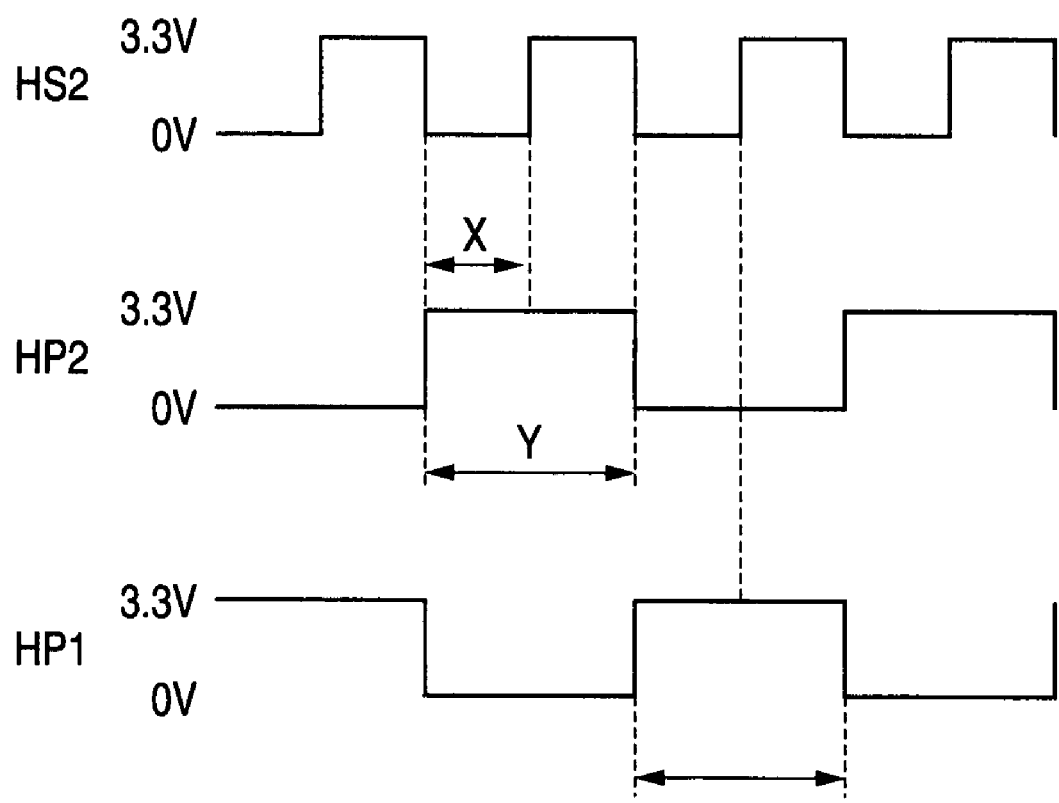
FIG. 5 is a timing chart of the transfer pulse to drive the FIG. 4 charge distributor.

FIG. 5 is a timing chart of the horizontal transfer pulse HS2 and of the transfer pulses HP1, HP2 to be applied to the branch transfer paths 104, 105. When the transfer pulse HS2 is applied to the first and second layer electrodes 103a, 103b adjacent closest to the charge distributor 120, the potential thereon shifts up or down as shown the arrows "A" in FIG. 4B.

The charge distributor 120 at distribution electrodes 120a, 120b is applied with a fixed voltage HSL so that the potential can be fixed on the charge distributor 120. In this state, when the application voltage becomes 0 V that is to the first and second layer electrodes 103a, 103b adjacent closest to the charge distributor 120, the potential on the first layer electrode 103a becomes smaller than the potential on the charge distributor 120b (in the upper in FIG. 4B). When it becomes 3.3 V, the potential on the first layer electrode 103a becomes greater than the potential on the charge distributor 120b (in the lower in FIG. 4B).

The signal charge, transferred along the horizontal transfer path, becomes confined in a narrow location as they go nearer to the charge distributor 120 because the channel becomes narrower in its width. When the application voltage becomes 0 V that is to the first and second layer electrodes 103a, 103b of the transfer path 103 adjacent closest to the charge distributor 120 (when raised up of the arrow "A" in FIG. 4B), the signal charge held on the first layer electrode 103a flows into the charge distributor 120 as shown at (X) in FIG. 4B.

The first and second branch transfer paths 104, 105 are being driven on the transfer pulses HP1, HP2 at a frequency half of the transfer pulses HS1, HS2. When the application voltage becomes 0 V to the first layer electrode 103 of the horizontal transfer path 103 adjacent closest to the charge distributor 120, a voltage of 3.3 V is being applied to the first and second layer electrodes 105a, 105b of the second branch transfer path 105 adjacent closest to the charge distributor 120 while a voltage of 0 V is being applied to the first and second layer electrodes 104a, 104b of the first branch transfer path 104.

Namely, the potential is high on the second branch transfer path 105 (in a state M in FIG. 4B) while the potential is low on the first branch transfer path 104 (in a state L in FIG. 4B). Accordingly, the signal charge flowed in the charge distributor 120 passes the charge distributor 120 and flows directly into the second branch transfer path 105 ((Y) in FIG. 4B).

According to the next transfer pulse HS2, the signal charge flows from the horizontal transfer path 103 into the charge distributor 120, which charge in this time flows into the first branch transfer path 104 because the potential is high on the first branch transfer path 104 (in a state M in FIG. 4B) while the potential is low on the second branch transfer path 105 (in a state L in FIG. 4B).

Figure 7:
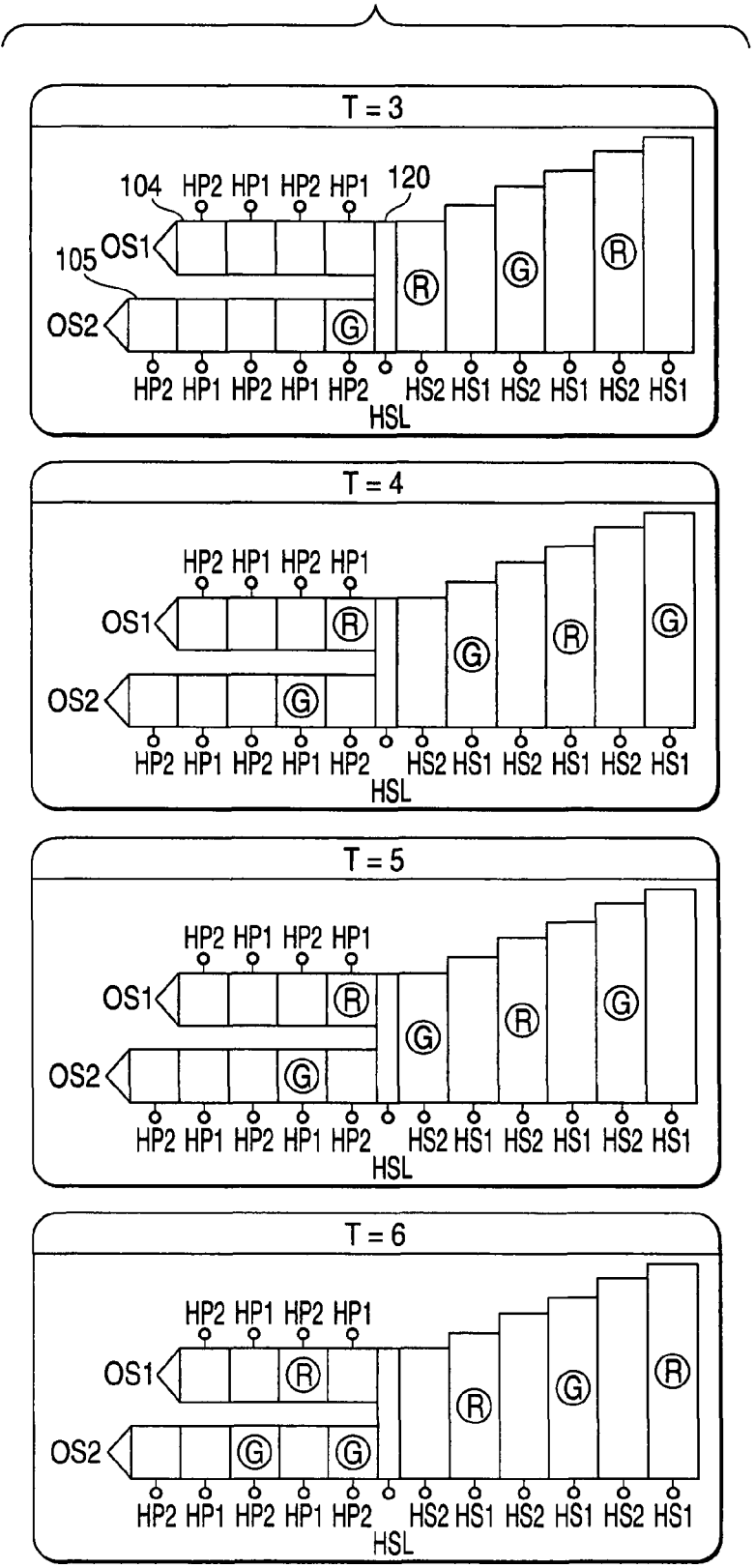
FIG. 7 is a typical view continuing from FIG. 6, exemplifying the order of the colors to be transferred from the FIG. 2 horizontal transfer path to the branch transfer paths.

FIGS. 6 and 7 are views exemplifying the order of the signal charges to be transferred from the horizontal transfer path 103 to the branch transfer paths 104, 105, wherein "R" represents a signal charge read out of the photodiode put with a red filter while "G" a signal charge read out of the photodiode put with a green filter. Along the horizontal transfer path 103, signal charges are being transferred in the order of R, G, R, G, . . . .

Due to signal charge transfer, when a signal charge R is first flows into the charge distributor 120 at timing T=2, the signal charge R passes the charge distributor 120 and flows into the second branch transfer path 105.

In the next timing T=3, a signal charge G in turn is transferred up to a position adjacent the charge distributor 120. When the signal charge G flows into the charge distributor 120 at T=4, the signal charge G passes the charge distributor 120 without stoppage and flows into the first branch transfer path 104.

Likewise, in the illustrated embodiment, every signal charge R flows toward the second branch transfer path 105 so that a voltage signal can be read by the output amplifier 107 provided at an output of the second branch transfer path 105. Every signal charge G flows toward the first branch transfer path 104 so that a voltage signal can be read by the output amplifier 106 provided at an output of the first branch transfer path 104.

In this manner, in the two-branch outputting solid-state imaging device 100 of this embodiment, a voltage signal is output as a signal having an amount in accordance with the signal charge transferred at a drive frequency half of that to the horizontal transfer path 103. Accordingly, even in case the horizontal transfer path 103 is driven at high rate, there encounters no disturbances in the output data waveform.

Meanwhile because of the structure to cause the signal charge transferred along the horizontal transfer path 103 to flow into the charge distributor 120 after being narrowed in its existence range and moreover the potential on the charge distributor 12 is fixed wherein the charge distributor 120 is made in a flat isosceles triangle narrowed in potential well width (length in the direction of signal charge flow), there are no remaining charges (meaning equivalently high charge transfer efficiency but, in this embodiment, the term "transfer efficiency" is not used because the charge distributor electrode is fixed in potential wherein no driving is made on a transfer pulse). Thus, the signal charge can be distributed to the first branch transfer path 104 or to the second branch transfer path 105.

As shown in FIG. 6, in this embodiment, the second branch transfer path 105 is provided with transfer electrodes one greater in stage than the transfer electrodes provided for the first branch transfer path 104. This is because to drive the first and the second branch transfer paths 104, 105 on the same transfer pulses HP1, HP2 so that the voltage signal of the signal charge R, transferred up to the output end through the second branch transfer path 105 can be read by the amplifier 107 simultaneously upon reading the voltage signal of the signal charge G, transferred up to the output end through the first branch transfer path 104, by means of the amplifier 106.

This can satisfactorily employ only one system of phase adjustment for making a correlated double sampling, at an analog front end, of the analog image data read out of the solid-state imaging.

In addition, the signal charges after voltage values are read can be damped simultaneously at the first and second branch transfer path 104, 105 onto a reset drain by use of the same reset signal. Incidentally, when damping the signal charges onto the reset drain, the signal charges are preferably narrow in existence range. For this reason, the first and second branch transfer paths 104, 105 are structured narrowed at their output ends.

Figure 8:
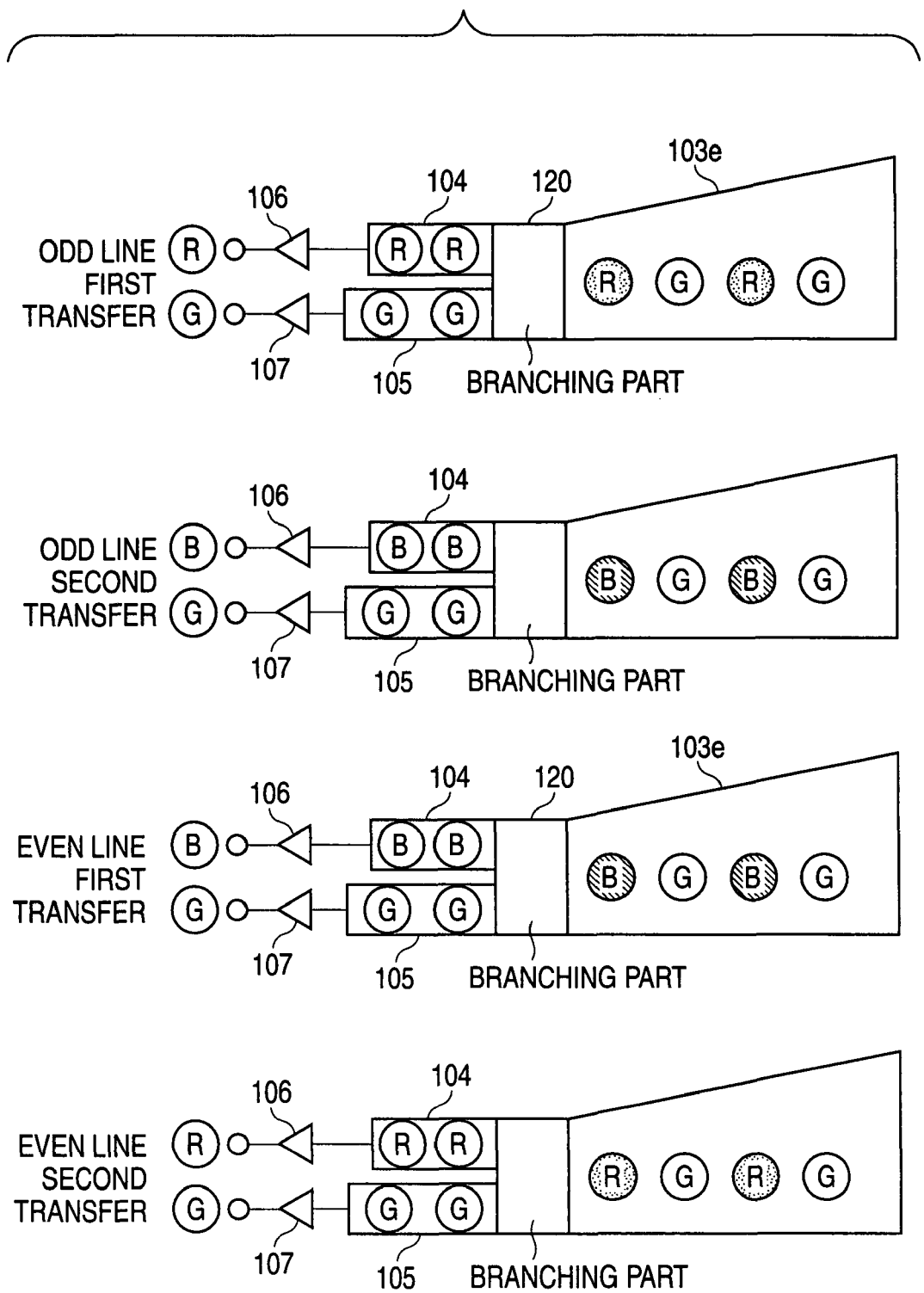
FIG. 8 is a figure showing a manner of transfer and distribution of color signal charges on the horizontal transfer path and the first and second branch transfer paths, in the FIG. 2 solid-state imaging device (solid-solid imager in a honeycomb pixel arrangement and having a line memory)

FIG. 8 is a figure illustrating the manner of charge transfer and distribution in outputting twice separately the signal charge read out of the photodiodes on the odd row (two rows, i.e. an RB line and a G line, assumed one row) and outputting twice separately the signal charge read out of the photodiodes on the even line (two rows, i.e. an BR line and a G line, assumed one row), by use of the line memory 108 on the FIG. 2 solid-state imaging device 100.

Signal charges read out of the odd-line photodiodes are arranged as "R, G, B, G, R, G, B, G, . . . " on the line memory 108. In the first transfer, transfer is made by putting only an arrangement portion "R, G" from the signal arrangement onto the horizontal transfer path. In the second transfer, transfer is made by putting the remaining arrangement portion "B, G" onto the horizontal transfer path.

After completing the output of the signal charges read out of the odd-line photodiodes, signal charges read out of the even-line photodiodes are being arranged as "B, G, R, G, B, R, G, . . . " on the line memory 108. In the first transfer, transfer is made by putting only an arrangement portion "B, G" from the signal arrangement onto the horizontal transfer path. In the second transfer, transfer is made by putting the remaining arrangement portion "R, G" onto the horizontal transfer path.

In transferring and outputting the charges, the present embodiment performs timing control of the transfer pulses HS1, HS2, HS3, HS4, HP1, HP2 such that the charge distributor 120 causes the signal charge G to flow toward the first branch transfer path 104 without fail and the signal charges R, B to flow toward the second branch transfer path 105 without fail.

Even where building output amplifiers 106, 107 in the same structure on a same semiconductor substrate by the common manufacturing process, it is difficult to make the characteristic equal to each other. However, by configuring to read the voltage signals in the same color of signal charges out of the same amplifier without fail, it is possible to absorb a gain difference of between the output amplifiers.

In the case of reproducing one-sheet photographic image from the image data based on R, G and B output from the solid-state imaging device, the FIG. 1 digital signal processing section 26 carries out a white balance correction. White balance correction means such a correction that an image "white" in nature even if taken under a light source for various colors is represented as a "white" photographic image wherein gain adjustment is made on the basis R, G and B such that the R, G and B ones of image data configuring one photographic image if all mixed together provide an "achromatic color" in the result thereof.

Even where there is a gain difference at between the two output amplifiers 106, 107, the same color of data if output from the same amplifier can absorb the gain difference of between the amplifiers due to a white balance correction. This makes it possible to reproduce a preferred quality of image data free of a gain difference reflected thereupon.

Figure 9:
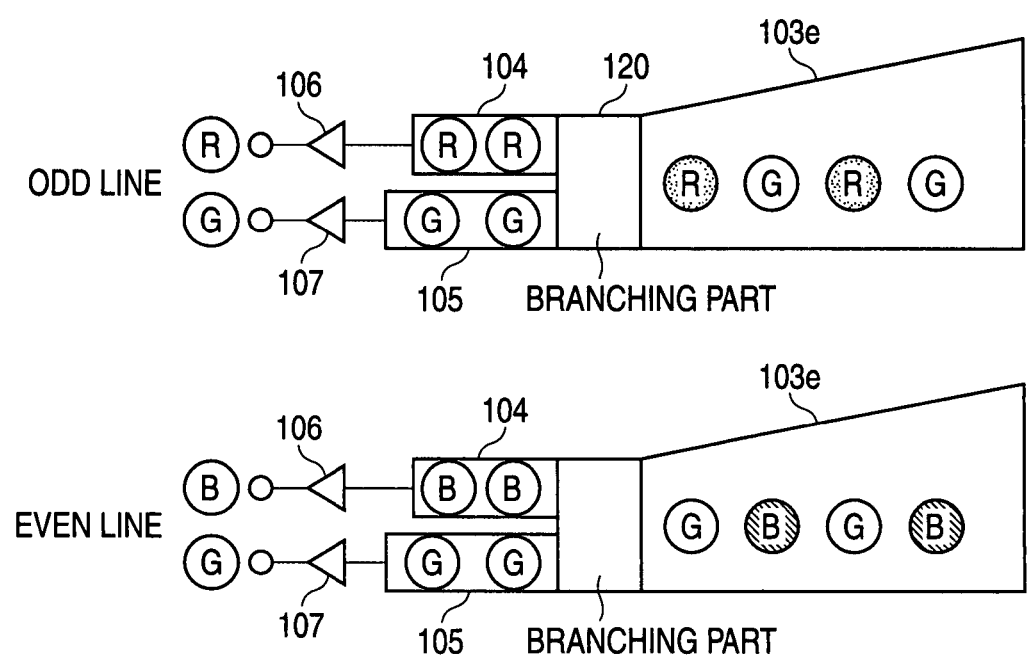
FIG. 9 is a figure showing a manner of transfer and distribution of color signal charges on the horizontal transfer path and the first and second branch transfer paths, in a solid-state imaging device according to another exemplary embodiment of the invention (solid-solid imager having color filters in a Bayer arrangement)

FIG. 9 is a figure illustrating the manner of transfer and distribution of color signal charges in reading signal charges out of the photodiodes and transferring those through the horizontal transfer path and the first and second branch transfer paths, in a solid-state imaging device arranged with pixels (photodiodes) in a square grid form and color filters in a Bayer arrangement.

In the case of this solid-state imaging device, the signal charges read out of the photodiodes on an odd row are arranged as "R, G, R, G, . . . " on the horizontal transfer path. The signal charges read out of the photodiodes on an even row are arranged as "G, B, G, B, . . . " on the horizontal transfer path.

When transferring and outputting the odd-row signal charge, a signal charge G is distributed to the first branch transfer path 104 while a signal charge R is distributed to the second branch transfer 105. Meanwhile, when transferring and outputting the even-row signal charge, a signal charge G is distributed to the first branch transfer path 104 while a signal charge B is distributed to the second branch transfer 105.

Due to this, the signal charge G is to be read out in voltage by the output amplifier 106 without fail while signal charges R and B are to be read out in voltage by the output amplifier 107 without fail. By carrying out the white balance correction, the gain difference can be absorbed at between the amplifiers 106, 107.

Figure 10:
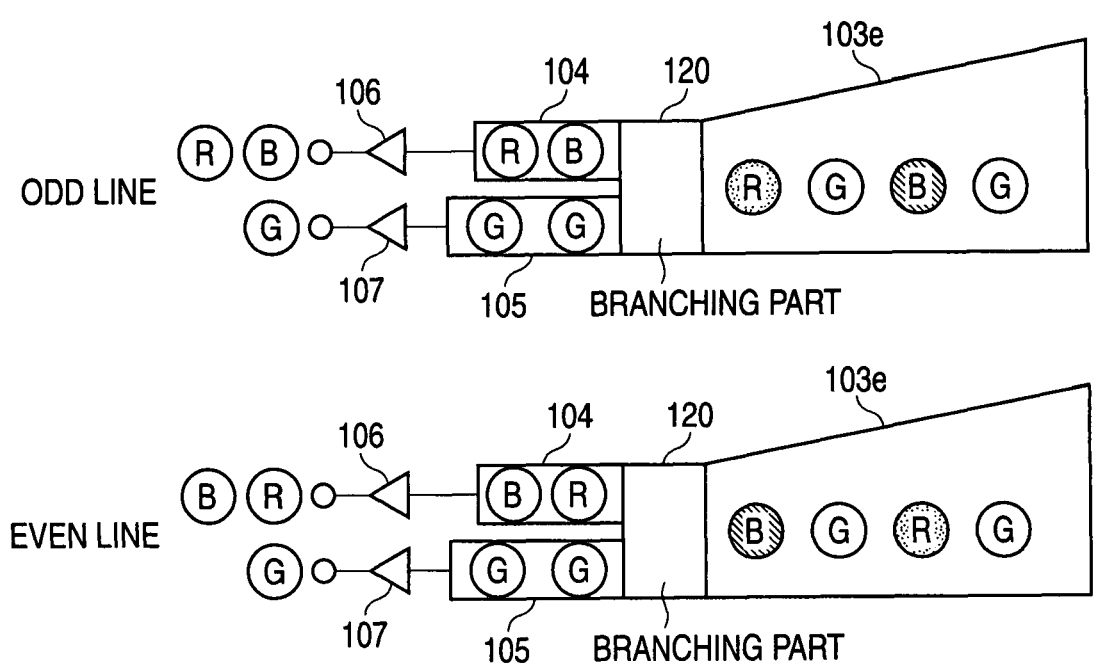
FIG. 10 is a figure showing a manner of transfer and distribution of color signal charges on the horizontal transfer path and the first and second branch transfer paths, in a solid-state imaging device according to still another exemplary embodiment of the invention (solid-solid imager in a honeycomb pixel arrangement and not having a line memory)

FIG. 10 is a figure illustrating the manner of transfer and distribution of color signal charges in transferring the signal charges, read out of pixels, through the horizontal transfer path and the first and second branch transfer paths, in a solid-state imaging having a honeycomb pixel arrangement without using the FIG. 2 line memory.

In the case of this solid-state imaging device, the signal charges read out of the odd-row (two row, i.e. lines RB and G, assumed one row) photodiodes arranged zigzag horizontally are in the order of "R, G, B, G, R, G, B, G, . . . " on the horizontal transfer path. The signal charges read out of the even-row even-row (two row, i.e. lines BR and G, assumed one row) photodiodes are in the order of "B, G, R, G, B, G, R, G, . . . " on the horizontal transfer path.

When transferring and outputting the odd-row signal charge, a signal charge G is distributed to the first branch transfer path 104 while signal charges R, B are distributed to the second branch transfer 105. Meanwhile, when transferring and outputting the even-row signal charge, a signal charge G is distributed to the first branch transfer path 104 while signal charges B, R are distributed to the second branch transfer 105.

Namely, regardless of whether on an even row or odd row, a signal charge G is to be read out in voltage by the output amplifier 106 without fail while signal charges R and B are to be read out in voltage by the output amplifier 107 without fail.

As a result, in this embodiment, the gain difference of between the amplifiers 106, 107 can be absorbed by performing a white balance correction.

Figure 11:
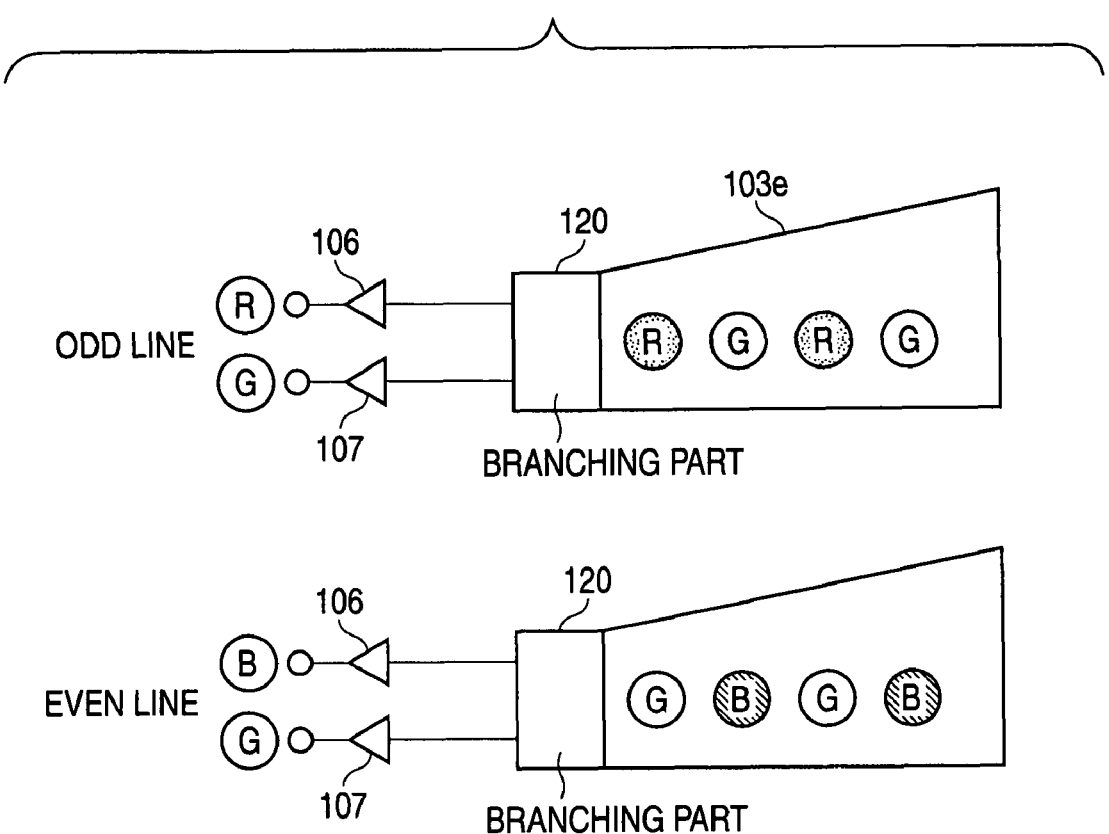
FIG. 11 is a figure showing a manner of transfer and distribution of color signal charges at the horizontal transfer path and branching part, in a solid-state imaging device according to yet another exemplary embodiment of the invention (solid-solid imager not having a line memory.

FIG. 11 is an explanatory figure of a solid-state imaging according to another exemplary embodiment of the invention. Although the solid-state imaging device in the foregoing embodiment branched the output end of the horizontal transfer path into two parts through a branching part (charge distributor) and provided charge transfer paths (first and second branch transfer paths) on the respective branch lines, the solid-state imaging in this embodiment is configured such that the output amplifiers 106, 107 can convert the signal charges, separated by the branching part, into voltage signals and output those.

This configuration also can absorb the gain balance of between the amplifiers by a white balance correction because the same color of signal charge is to be output from the same amplifier.

In the foregoing embodiments, signals R and B are read out of the first output amplifier 106 without fail while a signal G is read out of the second output amplifier 107 without fail. This is because of the following reasons.

Figure 12:
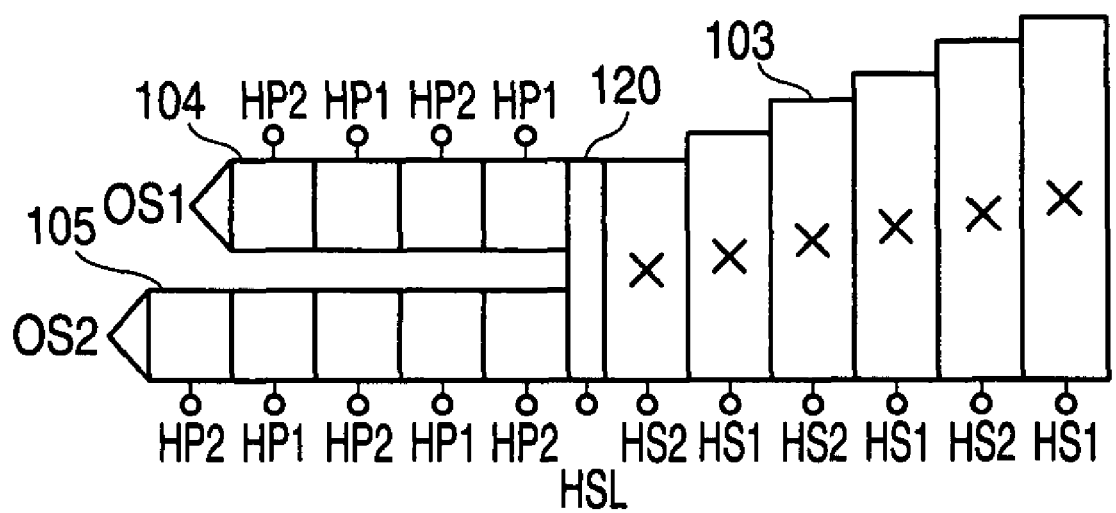
FIG. 12 is a figure explaining how to narrow the channel and distribute charges on the FIG. 3 solid-state imaging device.

FIG. 12 is a typical view showing a vicinity of the charge distributor 120. The horizontal transfer path 103 has an end 103e whose channel is narrowed in width at one side thereof, i.e. at the side extending along the first branch transfer path 104, as the charge distributor 120 is neared.

The mark "x" in the figure represents a positional change of center-of-gravity of the horizontal transfer path narrowed gradually. The signal charges, to be built up on the horizontal transfer electrode and transferred, are ideally distributed about the center-of-gravity in each location.

However, because the signal charge has a mass, it could not move immediately following the movement of the center-of-gravity even in case the center-of-gravity is moved by narrowing the width of the channel. For this reason, the signal charges distribute over the horizontal transfer path end 103e, whose center deviates relative to the geometric center-of-gravity in each location. In the illustrated example, the signal charges has a distribution whose center somewhat deviates toward the side extending along the first branch transfer path 104.

This means that the signal charge entered the branching part 120 is easy to flow to the first branch transfer path 104 but not easy to flow to the second branch transfer path 105. Namely, this means that residual charge possibly results higher in possibility concerning the signal charges to flow to the second branch transfer path 105 rather than the signal charges to flow to the first branch transfer path 104 though slight in amount.

For the two-branch outputting solid-state imaging device arranged to take a color image and distribute the signal charge thereof at the branching part 120, there is a need to consider which color of signal charge is advantageously distributed to each of its branch transfer paths in respect of color image reproduction on the assumption that residual charge "present" at the branching part 120.

For example, an image is assumed taken of a red subject. In the case of transferring and branching the signal charge G of a color image taken, there are two cases, i.e. signal charge R case and signal charge B case in the preceding stage.

Because the subject is red in color, signal charge R is greater in amount so that a greater amount of residual charge results. Signal charge B is less in amount so that a less amount of residual charge results. Namely, the signal charge G, following in state to the signal charge R, is greater in amount than the signal charge G following in stage than the signal charge B because of mixed residual part of signal charge R.

Because the red subject has been taken, the signal charge G in nature must be constant in amount regardless of its existence location. However, due to the existence of residual charge, the signal charge G differs in amount depending upon its existence location. This is to be observed as a checkered fixed pattern of noise that a signal G is arranged in an image taken thus constituting a factor deteriorating the quality of image.

For this reason, the foregoing embodiments based upon the "presence" of residual charge at the branching part. In order to positively utilize it, the horizontal transfer path has one end narrowed in channel width at its one side so that the signal charge in red (R) and blue (B) can be distributed to the first branch transfer path 104 arranged on the narrowed side while the signal charge in green (G) can be distributed to the second branch transfer path 104 arranged on the side not narrowed in channel width.

By providing such a structure for signal distribution, the leak or "color migration" of signal charge G into signal charges R and B, even in occur, is not easy to visually discriminate as compared to the checkered fixed pattern of noise thus having a less effect upon the quality of image.

Figure 13:
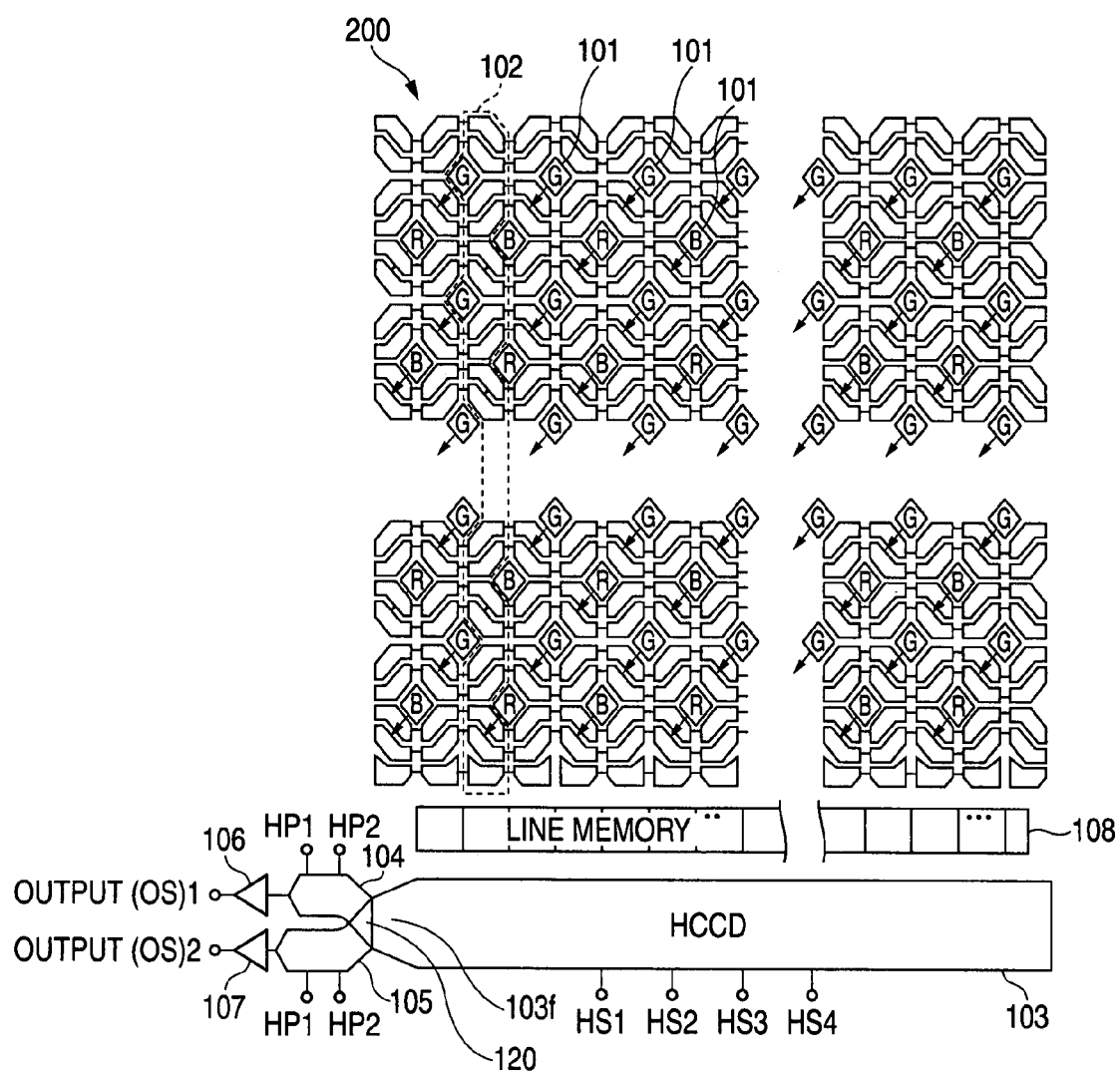
FIG. 13 is a surface view of a solid-state imaging device according to another exemplary embodiment of the invention.

FIG. 13 is a surface view of a solid-state imaging device according to another exemplary embodiment of the invention. The solid-state imaging device 200 in this embodiment is structured that its horizontal transfer path end 103f is narrowed in channel width at both sides and connected to the charge distributor 120. Because the other structure is similar to the structure of FIG. 2, the identical member is attached with the identical reference numeral to thereby omit the explanation thereof.

In the foregoing embodiment, the horizontal transfer path end was narrowed in channel width at its one side so that signal charges R and B can be distributed to the branch transfer path arranged on the narrowed side. This is because of a consideration on the residual charge extremely less in amount.

In distributing at the branching part 120 the signal charge transferred the horizontal transfer path 103, it is advantageous to provide an existence range of signal charge as narrow as possible in order to efficiently distribute it without causing a residual charge.

Accordingly, in the present embodiment, the horizontal transfer path end 103f is narrowed in channel width at both sides. With this structure, the signal charge has a distribution center, explained in FIG. 12, overlapping with the geometric center-of-gravity, thus distributing the charge equally in amount to the first and second branch transfer paths 104, 105.

The solid-state imaging device according to the invention is useful if mounted on a digital camera capable of taking an image with definition, e.g. high vision of image quality.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

This application claims foreign priority from Japanese Patent Application No. 2006-47078, filed Feb. 23, 2006, the entire disclosure of which is herein incorporated by reference.

What is claimed is:

1. A solid-state imaging device comprising:
    a semiconductor substrate having a two-dimensional array of photoelectric conversion elements, each storing a signal charge in accordance with a received amount of light;
    a charge transfer path that transfers the signal charge read out of the photoelectric conversion elements toward an output end of the solid-state imaging device; and
    a branching part having two branches, the branching part receiving the signal charge transferred along the charge transfer path and distributing the signal charge toward one of the two branches alternately, wherein the charge transfer path has an end portion narrowed in channel width and connected to the branching part, and the charge transfer path comprises:

a buried channel;

and a plurality of sets of a first layer electrode and a second layer electrode to which different transfer pulses are applied, and the plurality of sets of the first layer electrode and the second layer electrode in the end portion of the charge transfer path have widths perpendicular to a direction of transferring the signal charge, the widths being gradually narrowed as the branching part is neared, wherein the photoelectric conversion elements comprises: a plurality of first photoelectric conversion elements that store a first signal charge in accordance with a received amount of light having a first color; a plurality of second photoelectric conversion elements that store a second signal charge in accordance with a received amount of light having a second color; and a plurality of third photoelectric conversion elements that store a third signal charge in accordance with a received amount of light having a third color, wherein the first color is red of three primary colors, the second color is green of the three primary colors, and the third color is blue of the three primary colors, and wherein the end portion of the charge transfer path is narrowed in channel width from one side in a width direction of the charge transfer path, a specified one of the two branches of the branching part is located on the one side in the width direction of the charge transfer path, and the signal charge with respect to each of blue and red is distributed toward the specified one of the two branches.

2. The solid-state imaging device according to claim 1, wherein the end portion of the charge transfer path is narrowed in channel width from one side in a width direction of the charge transfer path.

3. The solid-state imaging device according to claim 1, wherein each of the two branches of the branching part has a branch transfer path.

4. The solid-state imaging device according to claim 1, wherein the branching part has a branch electrode to which a fixed potential is applied so that the signal charge entered the branching part can flow to the one of the two branches without change.

5. The solid-state imaging device according to claim 4, wherein the branch electrode is in a flat isosceles triangle form, wherein a bottom of the flat isosceles triangle form is continuously connected to the charge transfer path, one side of isosceles of the flat isosceles triangle form is continuously connected to one of the two branches, the other side of the isosceles is continuously connected to the other of the two branches.

6. The solid-state imaging device according to claim 1, wherein the photoelectric conversion elements is in a honeycomb arrangement on the semiconductor substrate.

7. The solid-state imaging device according to claim 1, wherein the charge transfer path comprises: a plurality of vertical transfer paths that transfer the signal charge in one direction along a surface of the semiconductor substrate; a horizontal transfer path that receives the signal charge and transfers the signal charge in a direction perpendicular to the one direction; and a line memory that receives the signal charge transferred through the vertical transfer paths and outputs the signal charge into the horizontal transfer path in a timing, and wherein the branching part is connected to the end of the horizontal transfer line.

8. An imaging apparatus comprising:

a solid-state imaging device according to claim 1; and a signal processing unit that integrates voltage signals output from the solid-state imaging device with respect to each color of the light, and that makes white balance correction.

\* \* \* \* \*